United States Patent
Debnath et al.

(10) Patent No.: US 10,205,299 B2
(45) Date of Patent: Feb. 12, 2019

(54) EXTERNAL CAVITY LASER COMPRISING A PHOTONIC CRYSTAL RESONATOR

(71) Applicant: University Court of the University of St Andrews, St Andrews (GB)

(72) Inventors: Kapil Debnath, Southampton (GB); William Whelan-Curtin, Fife (GB)

(73) Assignee: University Court of the University of St Andrews (GB)

( * ) Notice: Subject to any disclaimer, the term of this patent is extended or adjusted under 35 U.S.C. 154(b) by 0 days.

(21) Appl. No.: 15/520,126

(22) PCT Filed: Sep. 17, 2015

(86) PCT No.: PCT/GB2015/052686
§ 371 (c)(1),
(2) Date: Apr. 19, 2017

(87) PCT Pub. No.: WO2016/062998
PCT Pub. Date: Apr. 28, 2016

(65) Prior Publication Data
US 2017/0310075 A1    Oct. 26, 2017

(30) Foreign Application Priority Data

Oct. 20, 2014 (GB) .................................. 1418637.3

(51) Int. Cl.
*G02B 6/00* (2006.01)
*H01S 5/026* (2006.01)
(Continued)

(52) U.S. Cl.
CPC .............. *H01S 5/026* (2013.01); *H01S 3/105* (2013.01); *H01S 5/0625* (2013.01);
(Continued)

(58) Field of Classification Search
CPC ........ H01S 5/026; H01S 3/105; H01S 5/1003; H01S 5/142; H01S 5/105; H01S 5/0625; H01S 5/1096
See application file for complete search history.

(56) References Cited

U.S. PATENT DOCUMENTS 5,699,377 A    12/1997  Pan
6,549,688 B2   4/2003   Bazylenko
(Continued)

FOREIGN PATENT DOCUMENTS

CN    103 259 188 A    8/2013
JP    2004-063972      2/2004
(Continued)

OTHER PUBLICATIONS

International Search Report and Written Opinion prepared by the European Patent Office dated Nov. 24, 2015, for International Application No. PCT/GB2015/052686.
(Continued)

*Primary Examiner* — Ellen Kim
(74) *Attorney, Agent, or Firm* — Sheridan Ross P.C.

(57) ABSTRACT

A laser comprising: at least one wavelength selective reflector that comprises a waveguide vertically coupled to at least one photonic crystal resonator, the waveguide and photonic crystal resonator being arranged to provide wave-vector matching between at least one mode of the photonic crystal resonator and at least one mode of the waveguide; an optical gain medium for generating light for coupling into the waveguide, and a reflector at an end of the optical gain medium, the reflector and the photonic crystal resonator defining a laser cavity. Light generated by the optical gain medium is coupled into the waveguide and coupled into the photonic crystal resonator, and partially reflected back to the optical gain medium.

20 Claims, 8 Drawing Sheets

(51) Int. Cl.
*H01S 5/0625* (2006.01)
*H01S 5/10* (2006.01)
*H01S 5/14* (2006.01)
*H01S 3/105* (2006.01)

(52) U.S. Cl.
CPC ............ *H01S 5/1003* (2013.01); *H01S 5/105* (2013.01); *H01S 5/1096* (2013.01); *H01S 5/142* (2013.01)

(56) References Cited

U.S. PATENT DOCUMENTS

| | | | |
|---|---|---|---|
| 8,380,016 B1 * | 2/2013 | Hochberg | G02F 1/2257 385/131 |
| 8,611,756 B1 * | 12/2013 | Wach | G02B 6/43 385/129 |
| 9,240,673 B2 * | 1/2016 | Rickman | H01S 5/142 |
| 2006/0072642 A1 | 4/2006 | Wang et al. | |
| 2007/0280326 A1 * | 12/2007 | Piede | H01S 5/06804 372/102 |
| 2010/0187966 A1 | 7/2010 | Mochizuki | |
| 2010/0296159 A1 | 11/2010 | Ishizaka | |
| 2011/0267676 A1 * | 11/2011 | Dallesasse | H01S 5/021 359/279 |
| 2013/0235890 A1 | 9/2013 | Creazzo et al. | |

FOREIGN PATENT DOCUMENTS

| | | |
|---|---|---|
| WO | WO 2004/017477 | 2/2004 |
| WO | WO 2006/103850 | 5/2006 |
| WO | WO 2010/091688 | 8/2010 |
| WO | WO 2013/017814 A1 | 2/2013 |

OTHER PUBLICATIONS

Min Qiu: "Vertically coupled photonic crystal optical filters", Optics Letters, vol. 30, No. 12, 2005, p. 1476.

"Santur ramps-up production of 10X10 MSA-compliant 100Gbps CFP modules," Semiconductor Today, Jul. 20, 2011, 3 pages [retrieved online from: www.semiconductor-today.com/news_items/2011/JULY/SANTUR_200711.html].

Beausoleil et al. "A Nanophotonic Interconnect for High-Performance Many-Core Computation," IEEE, 16th IEEE Symposium on High Performance Interconnects, 2008, pp. 182-189.

Chu et al. "Compact, lower-power-consumption wavelength tunable laser fabricated with silicon photonic-wire waveguide micro-ring resonators," Optics Express, Aug. 2009, vol. 17, No. 16, pp. 14063-14068.

Galli et al. "Low-power continuous-wave generation of visible harmonics in silicon photonic crystal nanocavities," Optics Express, Dec. 2010, vol. 18, No. 25, pp. 26613-26624.

Li et al. "Four-wave mixing in slow light photonic crystal waveguides with very high group index," Optics Express, Jul. 2012, vol. 20, No. 16, pp. 17474-14479.

Marpaung et al. "Integrated microwave photonics," Laser Photonics Reviews, 2013, vol. 7, No. 4, pp. 506-538.

Takahashi et al. "Tunable Lasers Based on Silica Waveguide Ring Resonators," Optical Fiber Communication Conference and Exposition and the National Fiber Optic Engineers Conference, OWJ1, 2007, 3 pages.

Xu et al. "Scattering-theory analysis of waveguide-resonator coupling," Physical Review E, Nov. 2000, vol. 62, No. 5, pp. 7389-7404.

Zilkie et al. "Power-efficient III-V/Silicon external cavity DBR lasers," Optics Express, Oct. 2012, vol. 20, No. 21, pp. 23456-23462.

Search Report for United Kingdom Patent Application No. GB1418637.3, dated May 28, 2015, 4 pages.

* cited by examiner

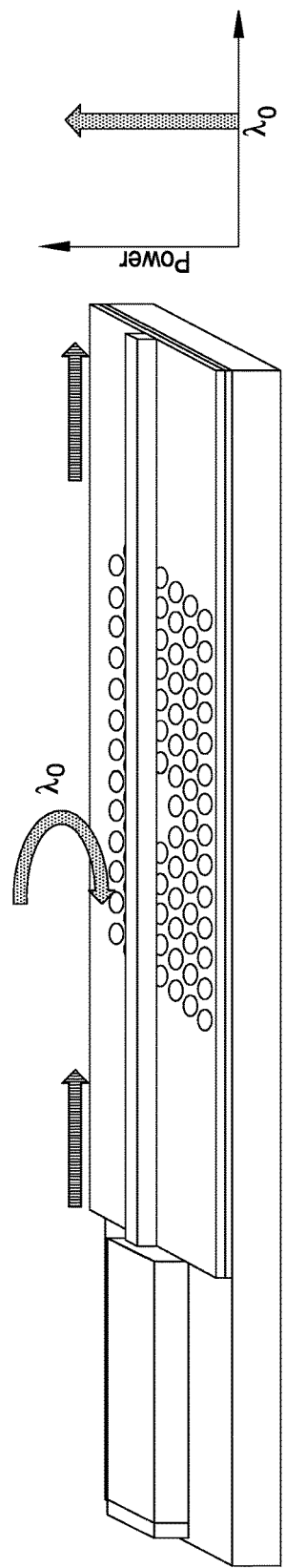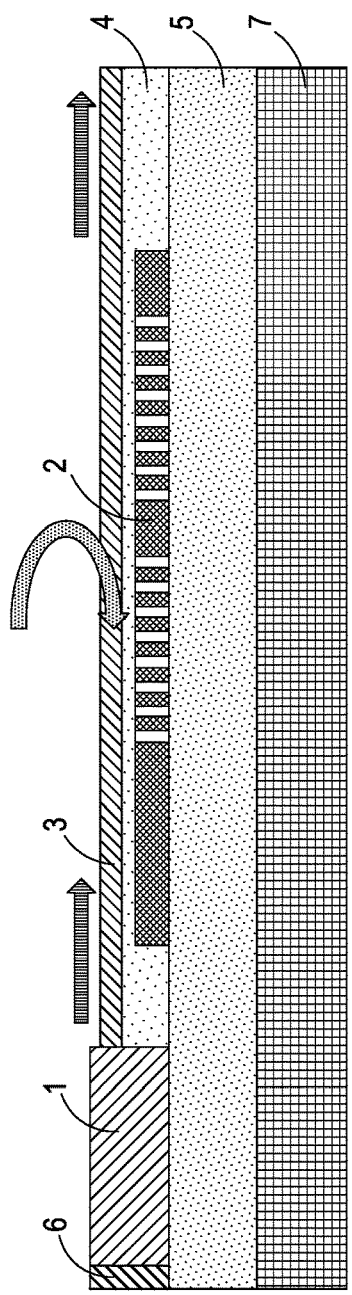
Figure 1a
Figure 1b

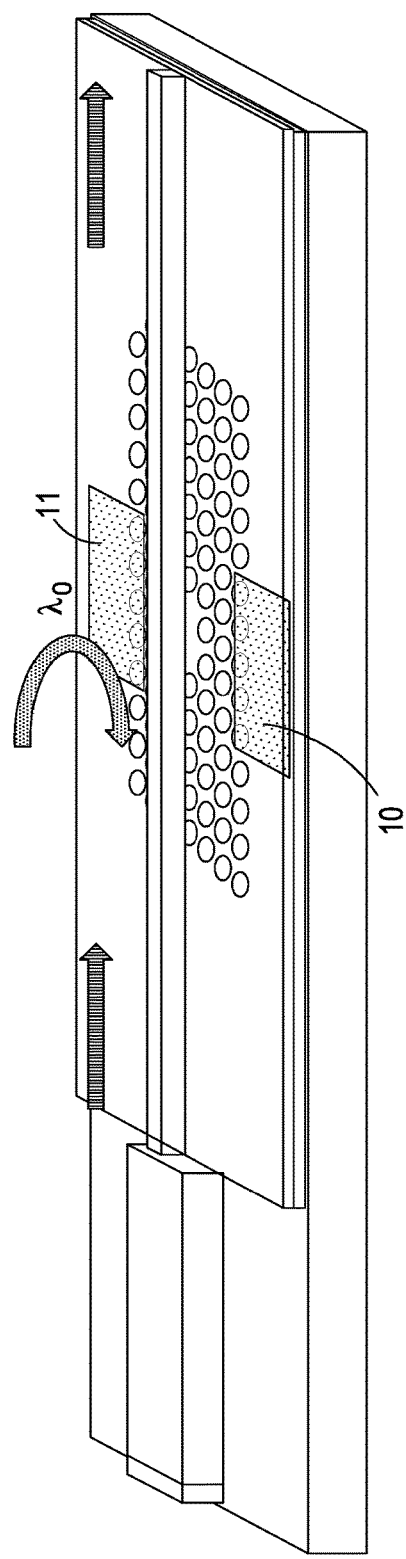

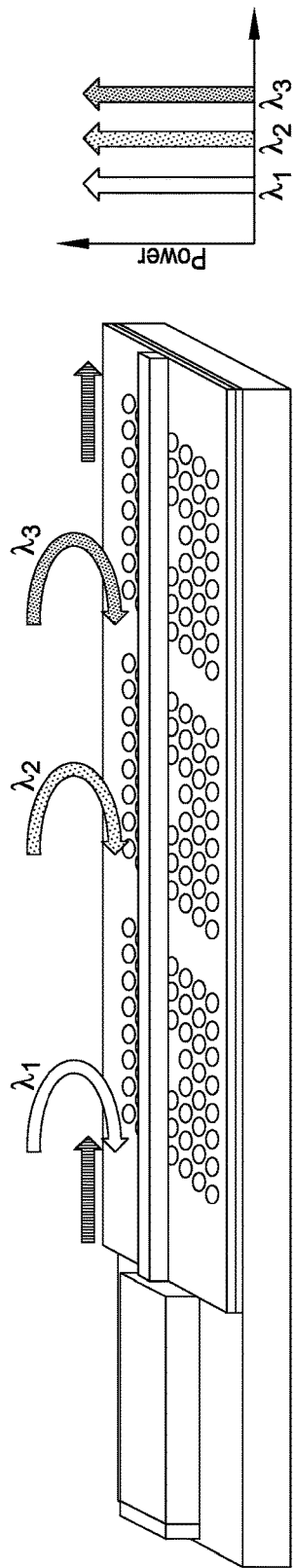
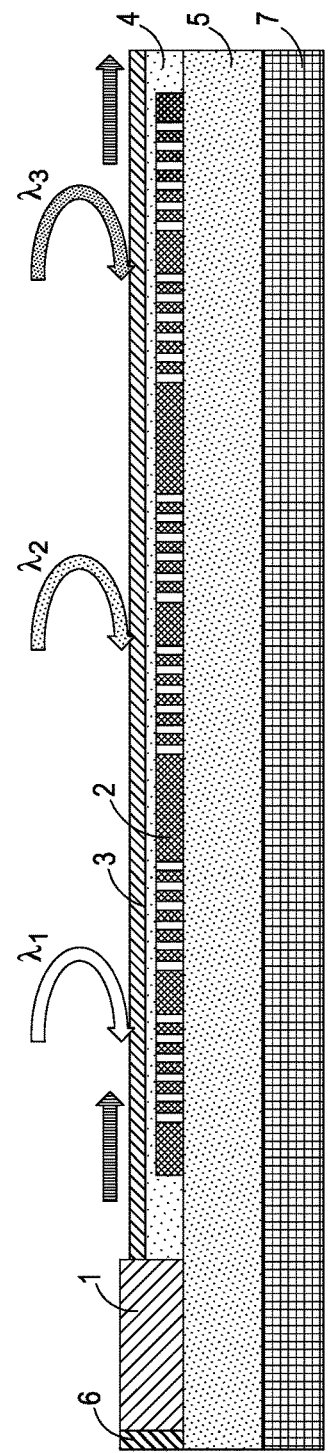
Figure 4a
Figure 4b

US 10,205,299 B2

EXTERNAL CAVITY LASER COMPRISING A PHOTONIC CRYSTAL RESONATOR

CROSS REFERENCE TO RELATED APPLICATIONS

This application is a national stage application under 35 U.S.C. 371 and claims the benefit of PCT Application No. PCT/GB2015/052686 having an international filing date of 17 Sep. 2015, which designated the United States, which PCT application claimed the benefit of Great Britain Application No. 1418637.3 filed 20 Oct. 2014, the entire disclosures of each of which are incorporated herein by reference.

FIELD OF THE INVENTION

The present invention relates to a laser and in particular a laser for use in data communication systems. More specifically, the present invention relates to an external cavity laser (ECL) and a method for making such a laser.

BACKGROUND OF THE INVENTION

Future data communications networks, ranging from high performance computers to Fibre-to-the-Home, will rely on cost-effective, power efficient optical transceivers to stem spiralling energy consumption. In IBM's latest supercomputer, the Power 775, a total of 668,000 VCSELs/Fibres were used, each carrying the same wavelength. In next generations, the number of channels required is expected to increase by almost two orders, while energy consumed per bit should reduce by an order of magnitude. This is unimaginable in the framework of VCSELS and multimode fibres, with the physical space consumed and the fibre cost fundamental limits.

Light sources are recognised as a major issue in data communications networks. The current relative success of VCSEL based approaches largely stems from their efficiency. In future, it is anticipated that data communications will have to use dense wavelength division multiplexing (WDM). A problem with VCSELs is that they are largely incompatible with WDM due to poor wavelength control and the difficulty in coupling multiple VCSELs to a single multimode fibre.

There is a number of ways of realising narrow linewidth single mode semiconductor lasers. There are two broad groups, monolithic semiconductor lasers and external cavity lasers. Both use frequency stabilisation to achieve single mode output over a range of operating conditions. The optical gain element is located between a high reflectivity mirror, often the coated back facet of the gain element, and the frequency selective component. Wavelength selectivity is often provided by a Distributed Bragg Reflector (DBR). In a monolithic device, this takes the form of a corrugation of the active layer giving rise to a grating. In an external cavity device, the grating can be realised in fibre, giving rise to a Fibre Grating laser, or in a silicon waveguide.

A difficulty with known lasers is the need to modulate the laser output in order to transmit data. Modulation of the gain is an option, but relaxation oscillations result in a highly chirped output and the bandwidth is limited. External modulators are used in high bandwidth applications. However, integration of these is complex, and discrete components are undesirable on stability grounds. Furthermore, it is difficult to achieve power efficient high speed tuning of components that have a significant capacitances (picofarad). Multiplexing must also be provided. In monolithic systems, this can be provided by III-V semiconductor arrayed waveguide gratings, but the high thermo-optic coefficient of III-Vs provides poor thermal stability. In addition, optical propagation losses and material losses are high. Planar light wave circuits provide high performance multiplexing. However, these are discrete components making assembly complex.

SUMMARY OF INVENTION

According to the present invention, there is provided a laser comprising: a wavelength selective element that has a waveguide vertically coupled to at least one resonator, such as a photonic crystal resonator, the waveguide and resonator being arranged to provide wave-vector matching between at least one mode of the resonator and at least one mode of the waveguide; an optical gain medium, for example a semiconductor optical amplifier, for generating light for coupling into the waveguide, and a reflector at an end of the gain medium, the reflector and the resonator defining a laser cavity.

In use, light generated by the semiconductor optical amplifier is coupled into the waveguide. This is broadband light of many different wavelengths. Light of the same wavelength as the resonant wavelength of the resonator is coupled into the resonator. Some of this light is reflected back to the reflector, and some is output. The wavelength of the light output by the laser is determined by the resonant wavelength of the resonator.

The invention provides an external cavity laser based on a photonic crystal device and a gain chip that provides tunable narrow linewidth emission with a small footprint and low power operation. The photonic crystal device comprises a large mode area waveguide that is positioned directly above a photonic crystal resonator. The rear facet of the gain chip may have a high reflectivity coating and the front an anti-reflection coating. The front facet of the gain chip is coupled to the waveguide on the photonic crystal chip.

On resonance, the photonic crystal resonator provides reflection with a very narrow linewidth, without sidelobes [Physical Review E 62, 7389-7404 (2000)], setting up the laser resonator and providing control over the lasing wavelength. The resonance wavelength of the photonic crystal reflector may be tuned at high speed, and with a suitable choice of parameters, a direct frequency modulated laser may be realised. The large mode area waveguide provides a platform for multiplexing and other advanced functions [Laser and Photonics Reviews 7, 506-538 (2013)].

The at least one resonator may be of a material of different refractive index to that of the waveguide $n_a$. The at least one resonator may be in a layer of refractive index $n_b$. The device may further comprise a barrier layer of refractive index $n_c$, whereby $n_c < n_a$ and $n_c < n_b$, and a lower cladding of refractive index $n_d < n_b$; wherein the resonator layer is between the barrier layer and the lower cladding, and the waveguide is on top of the barrier layer and aligned with the at least one resonator.

The waveguide may carry a single mode or the waveguide may be multimode.

The at least one resonator may carry a plurality of modes, among which at least one cavity-mode overlaps spatially with at least one mode propagating through the waveguide, thereby allowing for coupling of light from the waveguide to the resonator.

The laser may have N wavelength specific resonators, where N is greater than one, so as to be operable to output N different wavelengths.

The waveguide may be a glass, a TRIPLEX or a HYDEX waveguide, or a polymer waveguide or a waveguide made of Silicon Oxynitride, Silicon Nitride or a dielectric waveguide.

The resonator may be a photonic crystal that has a network of holes forming a regular lattice defined by a set of parameters and wherein the parameters are selected to provide wave-vector matching between at least one mode of the resonator and at least one mode of the waveguide.

The photonic crystal may be made of Silicon or Silicon Nitride or of a III-V semiconductor material such as Indium Phosphide, Gallium Arsenide, Gallium Nitride or Indium Gallium Phosphide.

A modulator may be associated with each resonator. The modulator may be operable to change the resonant wavelength of its associated resonator.

At least one resonator may have a variable output. For example, at least one resonator may be embedded in a PIN or PN junction (comprising p-type and n-type doped regions) forming a resonator-modulator.

BRIEF DESCRIPTION OF THE DRAWINGS

Various aspects of the invention will now be described by way of example only, and with reference to the following drawings, of which:

FIG. 1(a) is a schematic view of a laser built around a narrow linewidth photonic crystal reflector and semiconductor optical amplifier;

FIG. 1(b) is a cross section through the laser of FIG. 1(a);

FIG. 1(c) is a schematic view of the laser of Figure (a) but with a modulator for allowing modulation of the laser output wavelength;

FIG. 4(a) is a schematic diagram showing a multi-wavelength laser source consisting of three cavities each with different resonance wavelengths;

FIG. 4(b) is a cross section through the laser of FIG. 4(a);

DESCRIPTION OF THE INVENTION

Figure 2:
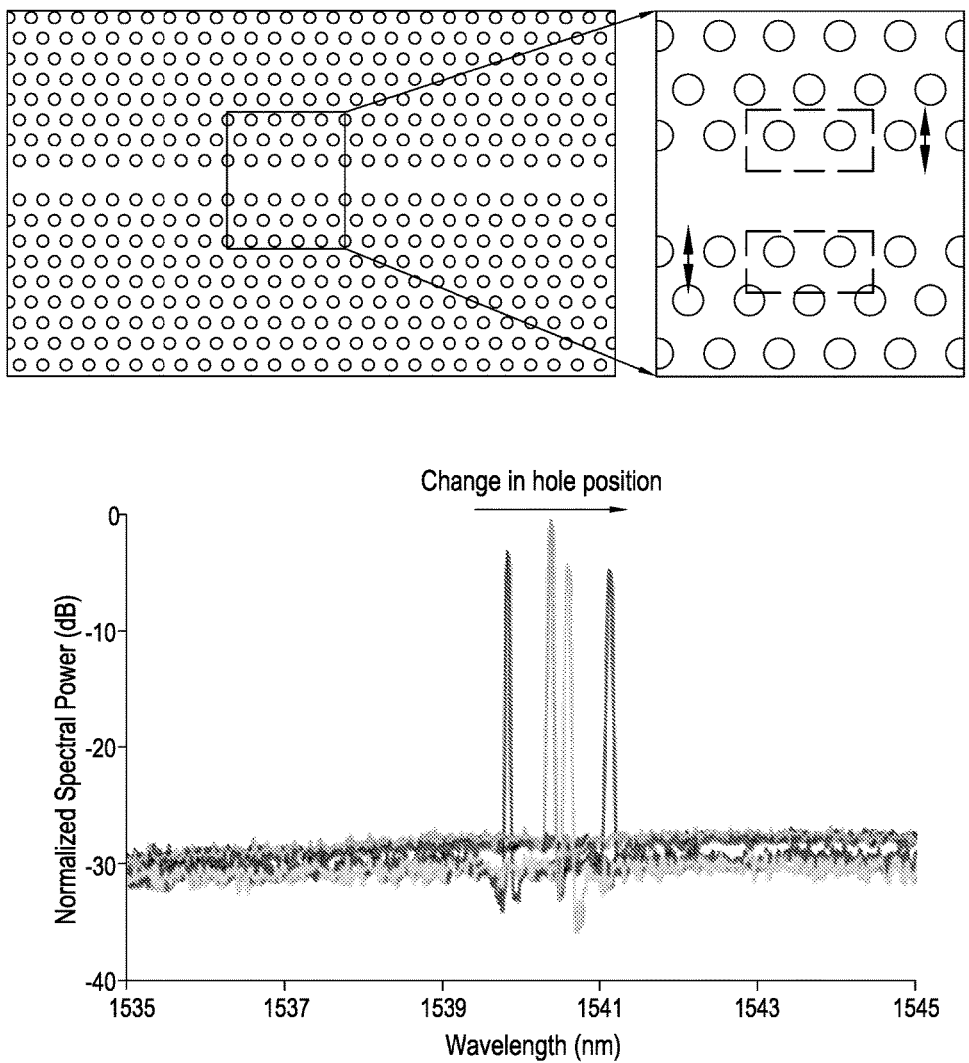
FIG. 2 shows normalised spectral power versus resonant wavelength for various different photonic crystal hole positions.

FIGS. 1(a) and (b) show a laser that has a wavelength selective component with a gain section, which combine to make an external cavity laser. The wavelength selective component has waveguide 3 with material refractive index $n_a$, which may have a large mode area, integrated with and positioned directly above a photonic crystal resonator 2. Modes in the waveguide and the photonic crystal resonator are vertically coupled and overlap. The gain section has an electrically pumped semiconductor optical amplifier 1 that generates relatively broadband light (for example having a bandwidth of 50-100 nm) that is coupled directly into the waveguide of the wavelength selective component using, for example butt coupling. A reflector 6 is provided on a rear surface of the semiconductor optical amplifier 1. Optionally, an anti-reflection layer is provided on the front surface of the semiconductor optical amplifier 1. The reflector 6 and the photonic crystal resonator 2 define an external laser cavity.

The photonic crystal resonator 2 is in a material of refractive index $n_b$ arranged between a barrier layer 4 of refractive index $n_c$ and a cladding dielectric layer 5 of refractive index $n_d$. The cladding layer 5 is on a substrate layer 7, with index $n_a$. In most cases, the material used has $n_b > 1.8$. Also, in practice, $n_b$ is not equal to $n_a$. Typically, the barrier layer is 100-200 nm thick. In some cases, a gap may be provided between the waveguide and the photonic crystal resonator, in which case the barrier layer would typically comprise air.

The photonic crystal resonator 2 is created by a structural defect or cavity in a photonic crystal that forms an optical mode localized to the defect region. The mode volume of the cavity mode is small enough to generate broad wave-vector distributions, resulting in increased coupling with the waveguide. In particular, the mode volume of the cavity is less than ten cubic wavelengths, where the wavelength is the resonant wavelength of the cavity. The resonator has a unique resonant wavelength. Only the waveguide modes at the resonant frequency couple to the cavity.

The waveguide 3 extends along the longitudinal axis of the photonic crystal and is placed on top of the barrier layer so as to align vertically with the resonator 2. The thickness profile of the barrier layer 5 may vary to promote or repress coupling between the waveguide and the defect-cavity in different parts of the device. The relative values of the refractive indices $n_a$, $n_b$, $n_c$ and $n_d$ are chosen to promote vertical evanescent coupling between the at least one mode propagating through the waveguide 3 and the mode propagating through the resonant cavity. This is typically achieved when the following conditions are met:

$$\{n_c < n_a, n_c < n_b, n_b \neq n_a, n_d < n_b, n_d < n_a\}$$

In use, light generated by the semiconductor optical amplifier 1 is at least partially reflected by photonic crystal resonator 2. The lasing wavelength is set by that of the photonic crystal resonator 2. When the incident light is resonant with the photonic crystal cavity, a portion is coupled into the cavity and experiences a $\pi/2$ phase shift. When this is coupled from the cavity, it experiences an additional $\pi/2$ phase shift. In the forward direction, some of the light from the cavity destructively interferes with a portion of the forward propagating light carried by the waveguide, and some propagates forward. In the backward direction, light that is coupled out of the cavity provides feedback to the laser cavity/resonator. This causes light at the resonant wavelength of the photonic crystal cavity to become dominant in the laser cavity. Hence, the wavelength of the light output from the laser is determined by the resonant wavelength of the photonic crystal cavity. The photonic crystal resonator transmits a portion of incident light. The levels of transmitted and reflected light can be controlled by suitable design of the photonic crystal resonator and waveguide.

The photonic crystal resonator has a small mode size. Because of this, it has an expanded wave vector space allowing phase matching with the waveguide, which is typically made of a low modal index polymer. On resonance, light is coupled in the photonic crystal resonator and out-coupled in the opposite direction. Reflectivities in the range 10-90% and 0.1 nm linewidth or better can be achieved with a suitable design of the waveguide-resonator system and an ideal laser mirror.

As noted above, the photonic crystal reflector controls the lasing wavelength. In practice, the wavelength is defined by the position of the holes in the crystal. Small changes in the position can cause significant changes in the resonant wavelength, and so the lasing wavelength. FIG. 2 shows resonant wavelength as a function of hole position.

Figure 3:
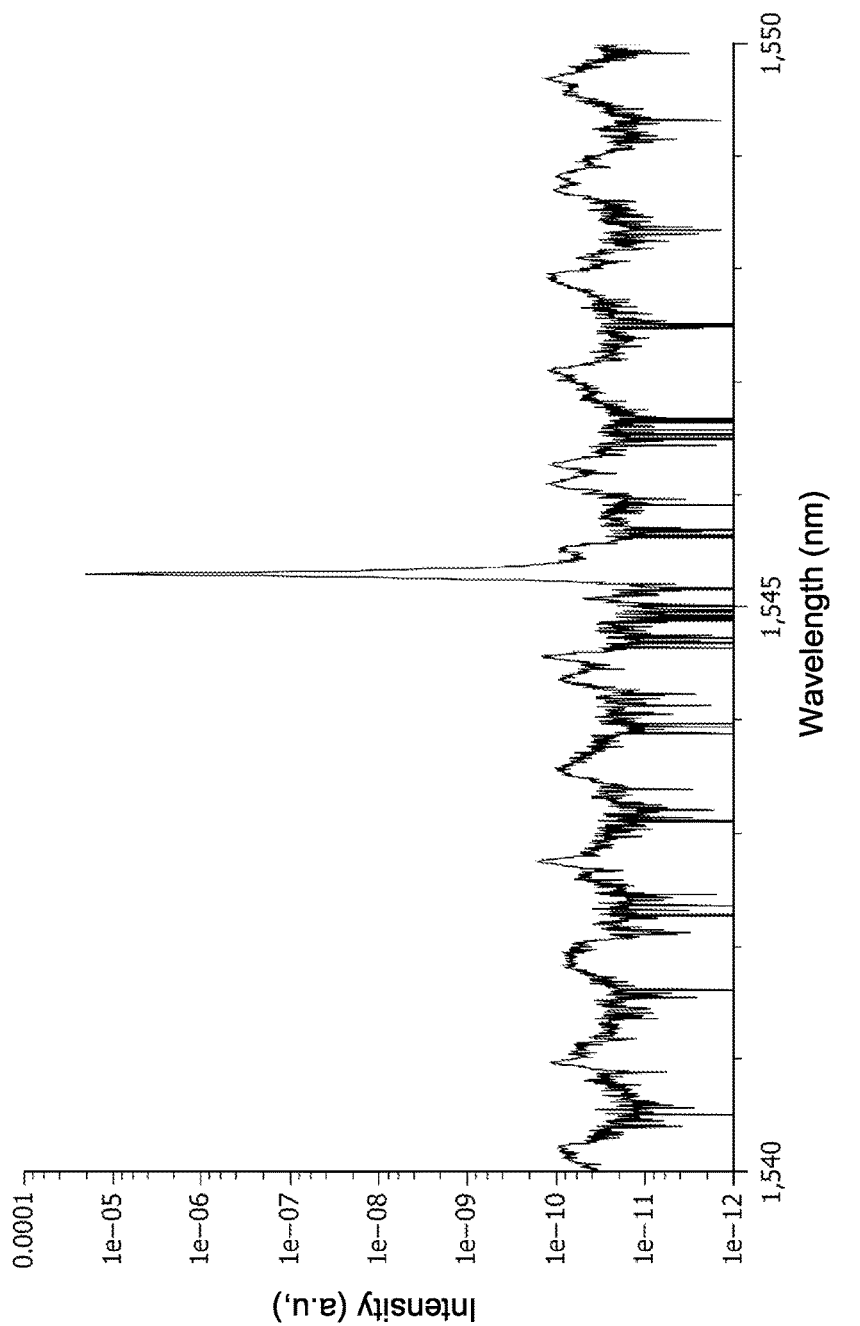
FIG. 3 is a plot of intensity versus wavelength for a photonic crystal laser.

The laser of the invention uses a photonic crystal reflector. This has a number of advantages with respect to a Distributed Bragg Reflector. The reflection spectrum does not exhibit the side lobes typical of the DBR, enabling the realisation of high side mode suppression ratio lasing. Linewidths are also much narrower (<0.1 nm) adding in the selection of a single longitudinal mode. This is shown in FIG. 3. Using a photonic crystal reflector is a cheaper means of achieving precise control of the lasing wavelength as lasing wavelength is defined only by the photonic crystal cavity and is independent of the materials used to provide gain. In contrast, for DFB or DBR lasers, the same material system, typically III-V semiconductor, for both the gain and the reflector making precise control more difficult.

The laser of FIGS. 1(a) and (b) may be adapted to realise a modulated laser, for example a frequency modulated laser. This can be done by combining a tuning element such as a pin or pn diode with the photonic crystal resonator(s). The lasing wavelength will track the resonance wavelength of the photonic crystal cavity providing a laser whose wavelength varies in time. As an example, the resonator may be embedded between a P doped region 10 and an N doped region 11 of a photonic crystal slab to form a resonator-modulator, as shown in FIG. 1(c). The resonance wavelength can be controlled individually by varying a voltage applied to the associated P and N doped regions 10 and 11 respectively.

FIGS. 4(a) and (b) show a laser that has multiple wavelength selective components with an off-chip gain section, which combine to make multiple external laser cavities. In this case, the basic layer structure of the wavelength selector is the same as for FIG. 1. However, multiple photonic crystal resonators are provided in series, each being vertically coupled to the waveguide. Each resonator is arranged to have a different resonant wavelength. The off chip gain section has a reflective semiconductor optical amplifier that has a broadband (100 nm+) reflector at one end. The multiple photonic crystal resonators and the mirror combine to make multiple external laser cavities. Within each cavity a different wavelength of light circulates, the wavelength being defined by the photonic crystal resonator.

Whilst not shown, it will be appreciated that each of the photonic crystal resonators of FIG. 4 could be associated with a modulator, so that its output can be modulated. For example, each could have the P and N doped regions described with reference to FIG. 1(c). The resonance wavelength can be controlled individually by varying a voltage applied to the associated P and N doped regions. Each of the photonic crystal resonators could be controlled individually or together.

Figure 5:
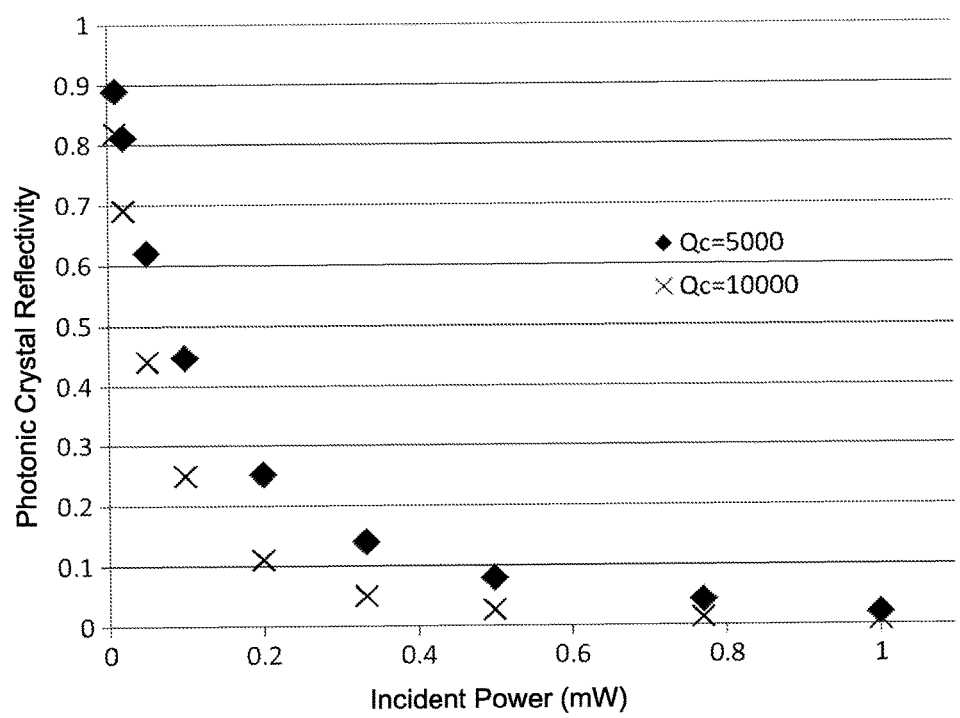
FIG. 5 is a plot of photonic crystal reflectivity vs incident power for the laser of FIG. 4.

The laser of FIG. 4 has an optical output that can provide multiple different wavelengths simultaneously, while maintaining stable continuous wave operation. Due to the nature of the photonic crystal reflectors and the cavity-waveguide vertically coupled structure multiple cavities can be cascaded together. Here, each cavity has a slightly different resonance wavelength and hence reflects different wavelengths. Each cavity along with the mirror 6 on the other side of the semiconductor optical amplifier 1 forms a different laser cavity with distinct wavelengths. Minimising competition between lasing modes is crucial to minimising relative intensity noise. The effects of two photon absorption, the reflectivity of each photonic crystal reflector reduces with increasing coupled power, see FIG. 5. This equalizes the power of each lasing mode and stabilizes the multi-wavelength output. This effect may be realised by striking a balance between waveguide cavity coupling and the loss introduced by two photon absorption. The cavity Q-factor is given by the following equation:

$$\frac{1}{Q_{total}} = \frac{1}{Q_{intrinsic}} + \frac{1}{Q_{coupling}} + \frac{1}{Q_{TPA}}$$

Where $Q_{total}$ is the overall Q-factor, $Q_{intrinsic}$ the unloaded Q-factor (in the absence of losses due to TPA), $Q_{coupling}$ is the Q-factor associated with coupling between the resonator and the waveguide, and $Q_{TPA}$ is associated with losses due to two photon absorption, which is a function of the incident power.

The reflectivity (R) of the photonic crystal reflector is given by:

$$R = \left(\frac{Q_{coupling}}{Q_{total}}\right)^2$$

By varying $Q_{coupling}$ appropriately, the reflectivity can be made more or less sensitive to the effects of two photon absorption. To provide a mode equalizing reflectivity, $Q_{coupling}$ (controlled via design) and $Q_{TPA}$ at the desired power (determined through a detailed study of effects of power on the PhC reflector) should be chosen such that a change in the incident power changes the reflectivity significantly (e.g. from more than 20% to less than 10%) see FIG. 5.

In a further embodiment, an array of identical photonic crystal cavities are coupled together and used to provide multi-wavelength feedback into the gain medium through four wave mixing. Photonic crystals are highly effective at increasing the efficiency of otherwise weak nonlinear phenomena [Optics Express 18, 26613-26624 (2010), Optics Express 20, 17474-17479 (2012)] giving rise to significant frequency conversion in silicon at milliwatt and microwatt power levels. With a suitable set of coupled silicon photonic cavities, each resonant at the same wavelength, mode splitting takes place and a system with multiple resonances evenly spaced in frequency can be realised. The initially single wavelength lasing will match one of the central resonances and light will build up in the coupled cavity system, acting as the pump. Parametric processes occur in the coupled photonic crystal cavity system to generate signal and idler waves, seeded by spontaneous emission from the semiconductor optical amplifier coupled into the coupled cavity system via the split resonances. The signal and idler waves will be phase matched to the pump and will be coupled back into the semiconductor optical amplifier giving rise to lasing on additional longitudinal modes, which have a fixed phase relationship to the initial line. This provides a phase-locking mechanism that minimises mode competition and provides low modal relative intensity noise. Furthermore, with a suitably designed system, cascaded four wave mixing can take place providing lasing at a large number of wavelengths.

In all of the above examples, a frequency modulated laser may be realised by combining a tuning element, such as a pin or pn diode, with the photonic crystal resonator(s), the tuning element being operable to tune (vary) the resonant wavelength of the photonic crystal resonator(s). The lasing wavelength will track the resonance wavelength of the photonic crystal cavity proving a laser whose wavelength varies in time.

Figure 6A:
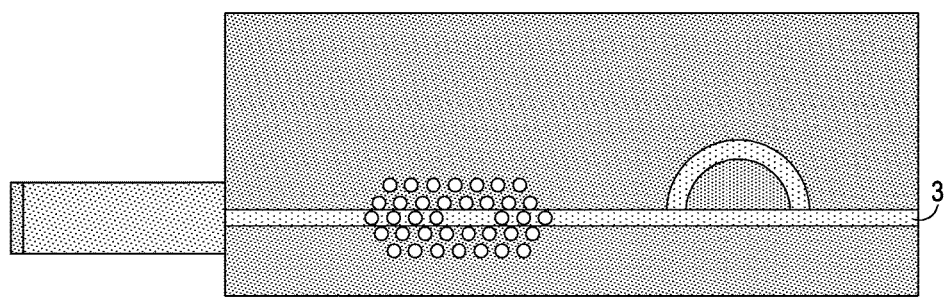
FIG. 6(a) shows an asymmetric MZI with arms of different lengths.
Figure 6B:
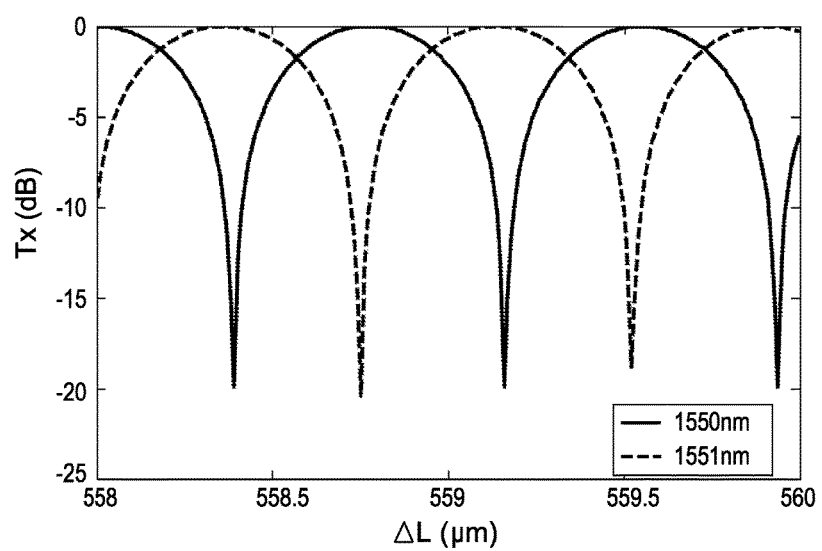
FIG. 6(b) is a plot of transmission at two different wavelengths as a function of difference in length between the arms of the MZI.

Instead of wavelength modulation, intensity or amplitude modulation can also be realised. This can be done using an asymmetric Mach Zehnder interferometer, as shown in FIG. 6. The asymmetric Mach Zehnder interferometer has an arm, in this case a loop of material, which extends from a first location on the waveguide to a second downstream location in the direction of light transmission. The arm is made of the same material as that of the waveguide. Some of the light transmitted along the waveguide passes into the arm and some continues along the length of the waveguide. Due to the difference in arm lengths, when light in the arm re-joins the main waveguide, the transmission is wavelength dependent. For example, at around $\Delta L=558.8$ μm, light at wavelength 1550 nm is completely transmitted due to the constructive interference between the two arms, whereas at 1551 nm almost no transmission is possible due to destructive interference between the two arms. By choosing an appropriate length of the arm, amplitude modulation can be realised.

Figure 7:
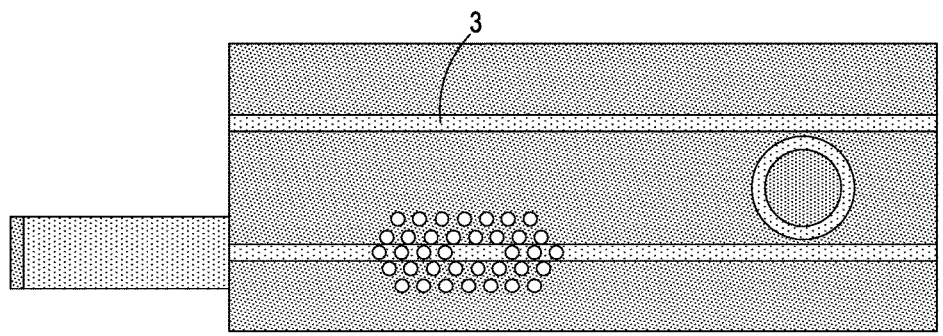
FIG. 7 is a schematic diagram showing another laser built around a reflective semiconductor optical amplifier and a narrow linewidth photonic crystal reflector.

FIG. 7 is a schematic diagram showing the laser built around a reflective semiconductor optical amplifier and a narrow linewidth photonic crystal reflector. A passive ring resonator is added on the output waveguide to enable frequency modulation to amplitude modulation conversion. In this case, an additional waveguide may be provided parallel to the first waveguide that is coupled to the ring resonator. This additional waveguide can be used as the laser output.

In a further embodiment, the reflectivity of the reflector on the rear facet of the semiconductor optical amplifier is reduced, producing an output beam. Depending on the application the output may be taken from either side of the laser.

The commercial application of the invention is in low-energy optical links, in particular the need for on computer chip optical networks such as those developed by Intel and IBM to reduce the use of electrical connections. A key advantage arises from the small capacitance of the photonic crystal reflector. Conventionally lasers or external modulators have capacitances in the hundreds of picofarad range resulting high power consumption during modulation. Here, only the photonic crystal reflector is modulated and femto-joule switching energies have already been experimentally demonstrated. Therefore, the power consumption of the laser is primarily that of the gain element which may be less than 20 mW for state of the art devices. At bit rates of 10-20 Gbit/s the energy per bit approaches 1 pJ, a ground breaking number. Furthermore, the electronic circuits required to drive a femtofarad modulator are much less expensive and consumes less power than those required for higher capacitance components.

This laser of the invention is not limited to applications in optical communications. It could also be used in optical sensing (for example remote optical sensing) in which the resonant frequency of the photonic crystal cavity changes in response to some stimulus. Such changes can, be detected using a filter combined with a photodiode.

The laser of the invention can be made using flip chip bonding. This type of bonding provides chip placement with better than 1 micron precision. When combined with large mode area waveguides, this allows the photonic crystal and gain chip to be assembled in a low cost manner yet giving very high coupling efficiencies. This combines favourably with wafer bonding based approaches, in which a III-V wafer or III-V dies are attached to a silicon wafer and then patterned, which invariably wastes a significant proportion of the III-V material. The flip-chip bonding based approach, on the contrary makes efficient use of expensive III-V material.

Figure 8:
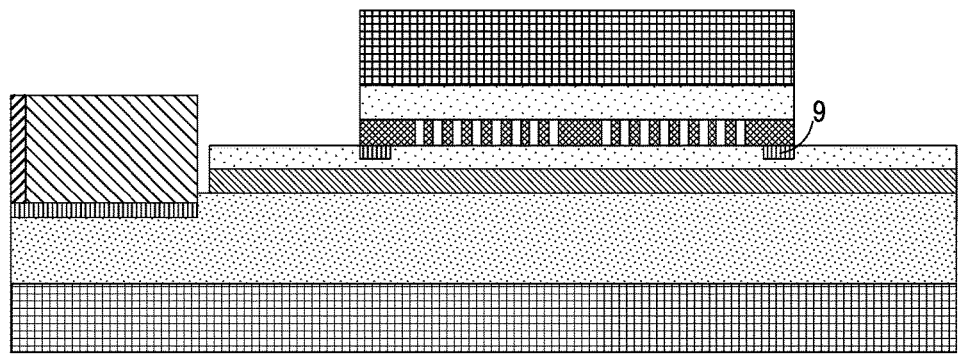
FIG. 8 is a schematic of a laser based on a narrow linewidth photonic crystal reflector and semiconductor optical amplifier that has been assembled using flip-chip techniques.

In another embodiment, a silicon chip containing the photonic crystal, and a chip containing the glass or polymer based waveguides are fabricated independently and assembled using flip-chip bonding and the gain chip subsequently attached, as shown in FIG. 8. In this case, each chip may be tested prior to assembly, improving yields. Solder pads 9 are used to connect the chips together.

A number of materials may be used for the construction of the wavelength selective device. The waveguide may be of a polymer or Silicon oxynitride or of more complex composite structures such as TriPleX™ or HYDEX®. The barrier layer may be a dielectric material such as silica, deposited using chemical vapour deposition techniques or spin-on glass. The photonic crystal slab may be manufactured in Silicon, Silicon Nitride or in a III-V semiconductor material such as Indium Phosphide, Gallium Arsenide, Indium Gallium Phosphide or Gallium Nitride. It could also be made of a Silicon/Germanium multilayer. The structure of the photonic crystal lattice may vary according to specifications as well as the number and design of defect-cavity resonators and resonator-modulators. The lower cladding is typically made of silica, though air is possible in some instances. The substrate is silicon or a III-V semiconductor.

A skilled person will appreciate that variations of the disclosed arrangements are possible without departing from the invention. For example, number of optional functions may be incorporated into the device. For example, where multiple resonators are provided, each may perform a different signal processing function, including that of filter, ON/OFF switch, amplitude modulator and dispersion compensator. Equally, rather than being monolithically integrated, the RSOA and silicon chip could be combined on a MEMS-based platform containing movable microlenses. In this case, the optical components are mounted onto the MEMS assembly using conventional assembly tools with relatively low precision. Parts can be off optimum position by tens of microns, with no optical connection to each other. The microlenses are movable to direct the optical components achieving efficient coupling. Once optimal alignment is achieved the microlenses are locked down, see U.S. Pat. No. 8,346,037. By using different materials, (e.g. GaAs for the gain chip and silicon carbide for the photonic crystal), narrow linewidths, high side mode suppression laser can be realised at other wavelengths. Accordingly the above description of the specific embodiment is made by way of example only and not for the purposes of limitation. It will be clear to the skilled person that minor modifications may be made without significant changes to the operation described.

The invention claimed is:

1. A laser comprising:
   at least one wavelength selective reflector that comprises a waveguide of refractive index $n_a$ vertically coupled to at least one photonic crystal resonator, the waveguide and photonic crystal resonator being arranged to provide wave-vector matching between at least one mode of the photonic crystal resonator and at least one mode of the waveguide;

an optical gain medium for generating light for coupling into the waveguide, and a reflector at an end of the optical gain medium, the reflector and the photonic crystal resonator defining a laser cavity, wherein light generated by the optical gain medium is coupled into the waveguide and coupled into the photonic crystal resonator, and partially reflected back to the optical gain medium, wherein the at least one photonic crystal resonator is of a material of different refractive index to that of the waveguide and wherein the at least one photonic crystal resonator is in a layer of refractive index $n_b$, and the device further comprises; a barrier layer of refractive index $n_c$, whereby $n_c<n_a$ and $n_c<n_b$, and a lower cladding of refractive index $n_d<n_b$ wherein the resonator layer is between the barrier layer and the lower cladding, and the waveguide is on top of the barrier layer and aligned with the at least one resonator.

2. A laser as claimed in claim 1, wherein the waveguide carries a single mode or the waveguide is multimode.

3. A laser as claimed in claim 1, wherein the at least one resonator carries a plurality of modes, among which at least one cavity-mode overlaps spatially with at least one mode propagating through the waveguide, thereby allowing for coupling of light from the waveguide to the resonator.

4. A laser as claimed in claim 1 comprising multiple resonators each operable at a different wavelength, so as to provide multiple different output wavelengths.

5. A laser as claimed in claim 4 wherein the multiple resonators are coupled so as to allow four wave mixing or another parametric process, thereby providing a mode phase locking mechanism.

6. A laser as claimed in claim 1 wherein the waveguide is a glass, a TRIPLEX or a HYDEX waveguide, or a polymer waveguide or a waveguide made of Silicon Oxynitride or a dielectric waveguide.

7. A laser as claimed in claim 1, wherein the photonic crystal has a network of holes forming a regular lattice defined by a set of parameters and wherein the parameters are selected to provide wave-vector matching between at least one mode of the resonator and at least one mode of the waveguide.

8. A laser as claimed in claim 1, wherein the photonic crystal is made of Silicon Nitride or of a III-V semiconductor material.

9. A laser as claimed in claim 1, wherein a modulator is associated with each resonator, the modulator being operable to change the resonant wavelength of its associated resonator.

10. A laser as defined in claim 9 where the modulator is operable to modulate an output of the laser at a modulation frequency in the 1-100 Gigahertz range.

11. A laser as claimed in claim 9 comprising a wavelength filter for converting the wavelength/frequency modulation to amplitude modulation.

12. A laser as claimed in claim 1 wherein the optical gain medium has a broadband wavelength output.

13. A laser as claimed in claim 1 wherein the optical gain medium is operable to be electrically stimulated to cause light emission.

14. A laser as claimed in claim 13 wherein the optical gain medium comprises a semiconductor optical amplifier.

15. A laser as claimed in claim 1 wherein the waveguide and the at least one photonic crystal resonator of the wavelength selector are monolithically integrated.

16. A laser as claimed in claim 1 comprising an array of photonic crystal reflectors, each photonic crystal reflector being such that its reflectivity reduces with increasing incident power.

17. A laser as claimed in claim 1 wherein the output is taken from a rear facet of a semiconductor optical amplifier.

18. A method of assembling a laser, comprising flip-chip bonding an optical gain medium to a waveguide of a wavelength selector element, wherein the laser comprises:

a wavelength selective reflector that comprises the waveguide of refractive index $n_a$ vertically coupled to at least one photonic crystal resonator, the waveguide and photonic crystal resonator being arranged to provide wave-vector matching between at least one mode of the photonic crystal resonator and at least one mode of the waveguide; the optical gain medium for generating light for coupling into the waveguide, and a reflector at an end of the optical gain medium, the reflector and the photonic crystal resonator defining a laser cavity, wherein light generated by the optical gain medium is coupled into the waveguide and coupled into the photonic crystal resonator, and partially reflected back to the optical gain medium, wherein the at least one photonic crystal resonator is of a material of different refractive index to that of the waveguide and wherein the at least one photonic crystal resonator is in a layer of refractive index $n_b$, and the device further comprises; a barrier layer of refractive index $n_c$, whereby $n_c<n_a$ and $n_c<n_b$, and a lower cladding of refractive index $n_d<n_b$ wherein the resonator layer is between the barrier layer and the lower cladding, and the waveguide is on top of the barrier layer and aligned with the at least one resonator.

19. A method of assembling a laser, comprising flip-chip bonding a waveguide of a wavelength selector element to at least one photonic crystal resonator, wherein the laser comprises:

a wavelength selective reflector that comprises the waveguide of refractive index $n_a$ vertically coupled to said at least one photonic crystal resonator, the waveguide and photonic crystal resonator being arranged to provide wave-vector matching between at least one mode of the photonic crystal resonator and at least one mode of the waveguide; an optical gain medium for generating light for coupling into the waveguide, and a reflector at an end of the optical gain medium, the reflector and the photonic crystal resonator defining a laser cavity, wherein light generated by the optical gain medium is coupled into the waveguide and coupled into the photonic crystal resonator, and partially reflected back to the optical gain medium, wherein the at least one photonic crystal resonator is of a material of different refractive index to that of the waveguide and wherein the at least one photonic crystal resonator is in a layer of refractive index $n_b$, and the device further comprises; a barrier layer of refractive index $n_c$, whereby $n_c<n_a$ and $n_c<n_b$, and a lower cladding of refractive index $n_d<n_b$ wherein the resonator layer is between the barrier layer and the lower cladding, and the waveguide is on top of the barrier layer and aligned with the at least one resonator.

20. A laser comprising:
- at least one wavelength selective reflector that comprises a waveguide of refractive index $n_a$ vertically coupled to at least one photonic crystal resonator, the waveguide and photonic crystal resonator being arranged to provide wave-vector matching between at least one mode of the photonic crystal resonator and at least one mode of the waveguide;
- an optical gain medium for generating light for coupling into the waveguide, and a reflector at an end of the optical gain medium, the reflector and the photonic crystal resonator defining a laser cavity,
- wherein a modulator is associated with each resonator, the modulator being operable to change the resonant wavelength of its associated resonator,
- and wherein the laser further comprises a wavelength filter for converting the wavelength/frequency modulation to amplitude modulation.

* * * * *